United States Patent [19]

Iyama et al.

[11] Patent Number: 4,974,206

[45] Date of Patent: Nov. 27, 1990

[54] NONVOLATILE SEMICONDUCTOR MEMORY DEVICE HAVING REFERENCE POTENTIAL GENERATING CIRCUIT

[75] Inventors: Yumiko Iyama; Junichi Miyamoto; Nobuaki Ohtsuka, all of Yokohama; Sumio Tanaka, Tokyo, all of Japan

[73] Assignee: Kabushiki Kaisha Toshiba, Kawasaki, Japan

[21] Appl. No.: 444,986

[22] Filed: Dec. 4, 1989

[30] Foreign Application Priority Data

Jan. 13, 1989 [JP] Japan ..................................... 1-7434

[51] Int. Cl.[5] ............................................. G11C 13/00
[52] U.S. Cl. ............................ 365/189.01; 365/189.09
[58] Field of Search ............... 365/185, 226, 227, 203, 365/189.01, 189.03, 189.04, 189.09

[56] References Cited

U.S. PATENT DOCUMENTS

4,843,594 6/1989 Tanaka et al. .................. 365/189.09
4,914,634 4/1990 Akrout et al. ................... 365/189.09

Primary Examiner—Terrell W. Fears
Attorney, Agent, or Firm—Finnegan, Henderson, Farabow, Garrett, and Dunner

[57] ABSTRACT

A semiconductor memory device includes a memory cell transistor, a voltage switching circuit supplied with a first voltage for data readout and a second voltage for data write and selectively generating one of the first and second voltages in response to a write control signal, a first driving circuit supplied with an output from the voltage switching circuit and driving the gate of the memory cell transistor in response to a memory cell selection signal, a sense circuit for sensing data of the memory cell transistor by comparing a sense potential corresponding to data from the memory cell transistor with a reference potential, a reference cell transistor for generating the reference potential, and a second driving circuit supplied with the output from the voltage switching circuit and driving the gate of the reference cell transistor in response to the write control signal.

10 Claims, 5 Drawing Sheets

NONVOLATILE SEMICONDUCTOR MEMORY DEVICE HAVING REFERENCE POTENTIAL GENERATING CIRCUIT

BACKGROUND OF THE INVENTION

1. Field of the Invention

This invention relates to a nonvolatile semiconductor memory device in which a sense amplifier compares a sense potential generated from a memory cell, with a reference potential generated from a reference cell having the same structure as the memory cell to sense data, and more particularly to a semiconductor memory device having a reference cell transistor for generating the reference potential whose gate voltage can be controlled in the readout and write-in operations.

2. Description of the Related Art

Figure 1:
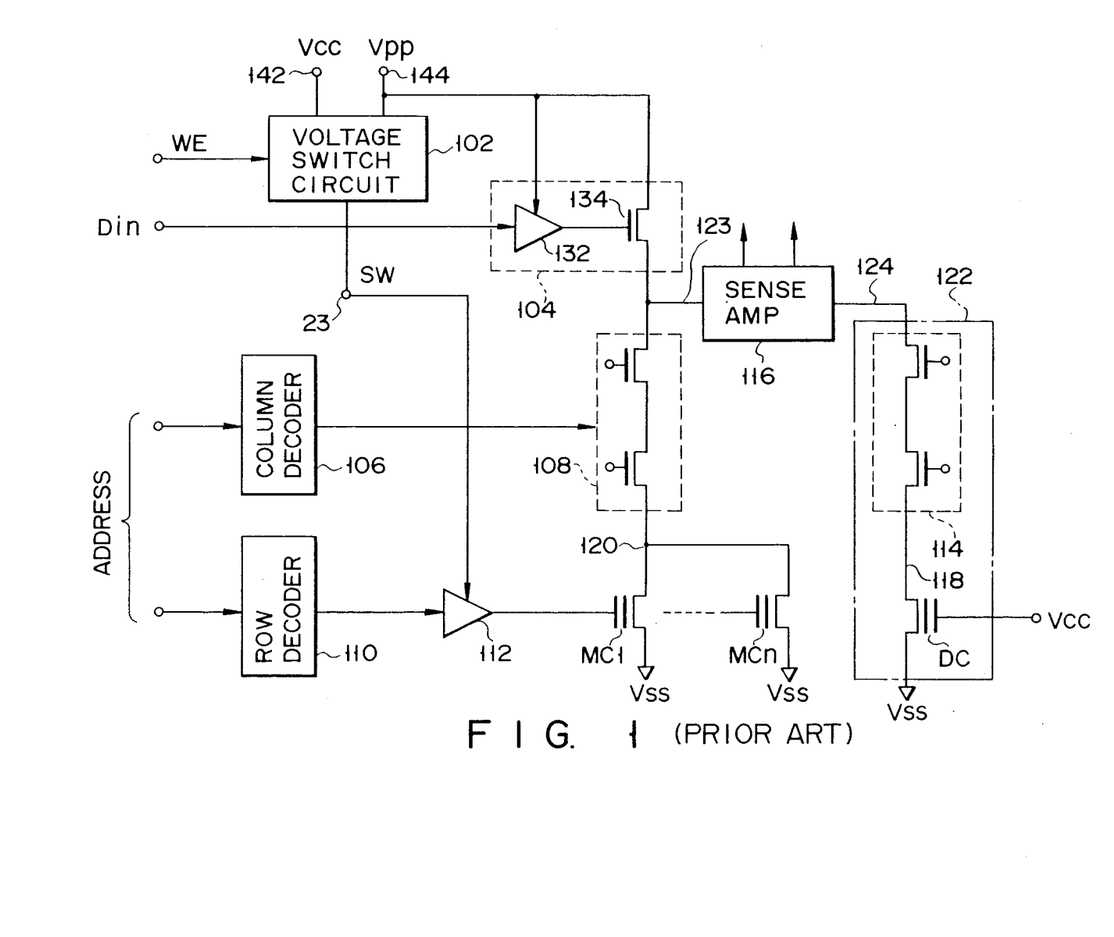
FIG. 1 is a block diagram showing the schematic construction of the conventional EPROM.
Figure 2:
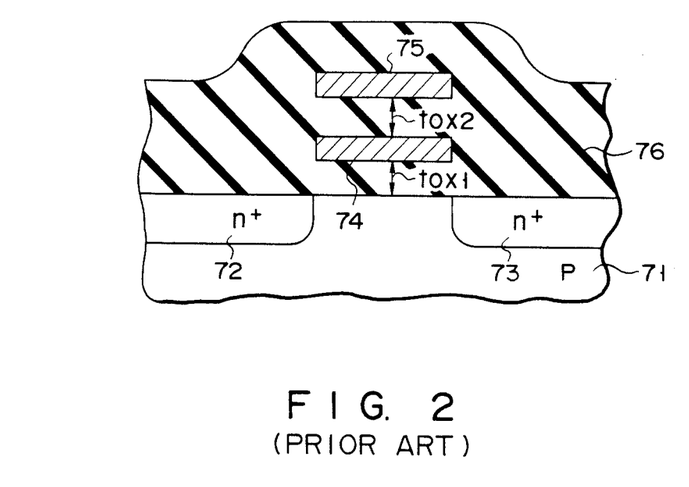
FIG. 2 is a cross sectional view showing the construction of a memory cell shown in FIG. 1.

FIG. 1 shows the schematic construction of a conventional semiconductor memory device, for example, a conventional electrically data programmable read only memory (EPROM). In FIG. 1, memory cell MC1 (like memory cell MCn) is a stacked gate transistor. FIG. 2 is a cross sectional view showing the construction of memory cell MC1. Source 72 and drain 73 formed of n+-type diffusion regions are formed in the surface area of p-type substrate 71, floating gate 74 is formed on that portion of the substrate which lies between the source and drain, and control gate 75 is formed on the floating gate. The film thickness of that portion of insulation film 76 which lies between substrate 71 and floating gate 74 is set to tox1 and the film thickness of that portion of insulation film 76 which lies between floating gate 74 and control gate 75 is set to tox2.

Since the EPROM is a nonvolatile memory, data programmed into memory cell MC1 can be permanently stored unless all the stored data is erased by application of ultraviolet rays. In this case, the "data programming" means that electrons are injected into floating gate 74 of memory cell MC1 and the data of the memory cell is set to "0". Memory cell MC1 having data of "1" is in the erased state. In order to program data "0" into the memory cell, write-in voltage Vpp of 12.5 V, for example, is simultaneously applied to drain 73 and control gate 75 of the memory cell, thereby causing hot electrons to be injected into the floating gate from the channel. As a result, the threshold voltage of the programmed memory cell transistor is raised and thus data is programmed into memory cell MC1 of the EPROM.

In the readout mode, voltage Vcc of 5 V, for example, is applied to control gate 75 to read out data stored in memory cell MC1.

As described above, in the EPROM, the level of a voltage applied to control gate 75 when data is programmed into memory cell MC1 is different from that applied when data is read out from the memory cell. Voltage Vcc (5 V) is applied in the data readout operation, and voltage Vpp (12.5 V) is applied in the data programming operation. Therefore, it is necessary to provide a switching circuit for internal power source which supplies voltages Vcc and Vpp in accordance with the internal state in addition to externally supplied power source voltages Vcc (5 V) and Vpp (12.5 V).

As shown in FIG. 1, the switching between voltages Vcc and Vpp is effected by use of voltage switching circuit 102. Switching circuit 10 is supplied with data readout voltage Vcc via terminal 142 and data programming voltage Vpp via terminal 144. The voltage Vcc or Vpp as voltage SW is selectively supplied according to an programming control signal (write enable signal). Voltage Vpp is also supplied to programming control section 104. Programming control section 104 includes transistor 134 whose drain and source are respectively connected to terminal 144 and column selection gate circuit 108 and programming control buffer 132 connected to receive voltage Vpp as a power source voltage for controlling the gate voltage of transistor 134 according to programming data Din.

Column decoder 106 decodes a column address included in the input address to output the decoded result to column selection gate circuit 108. Circuit 108 includes N-channel MOS transistors and selects bit line 120 based on the decoded result of decoder 106. Row decoder 110 decodes a row address included in the input address to output the decoded result to word in buffer 112. Buffer 112 is supplied with voltage SW from circuit 102 as the power source voltage and supplies a voltage to control gate 75 of memory cell MC1.

The source and drain of memory cell MC1 are respectively connected to ground voltage Vss and bit line 120. Bit line 120 is connected to one input terminal of sense amplifier 116 via transistors of column selection gate circuit 108. Sense amplifier 116 senses "1" or "0" of data stored in memory cell MC1 by comparing the potential of sense line 123 varying according to data stored in one of memory cells MC1 selected by row decoder 110 and column decoder 106 with a reference potential on line 124 to be described later.

Reference voltage generation circuit 122 supplies a reference voltage to sense amplifier 116. Circuit 122 includes reference cell DC constructed by the same stacked gate transistor as memory cell MC1 and that is in the erased state normally turned-on transistors 114 of the same number as the transistors series-connected in column selection gate circuit 108. The gate of reference cell DC is supplied with power source voltage Vcc. The level of the reference voltage is determined by turning on reference cell DC. In order to obtain a stable reference potential, it is necessary to design the transistor characteristics of memory cell MC1 and reference cell DC equal to each other.

With the above construction, when data is programmed into memory cell MC1, programming voltage Vpp is supplied as voltage SW from power source switching circuit 102 to word line buffer circuit 112. At the same time, programming voltage Vpp is supplied from programming controlling buffer 12 to the gate of programming controlling transistor 134. If the threshold voltage of transistor 134 is Vth, a voltage of (Vpp-Vth) is supplied to the drain of memory cell MC1 via column selection gate circuit 108. Word line buffer 112 supplies programming voltage Vpp to the control gate of memory cell MC1. As a result, hot electrons are injected into floating gate 74 to raise the threshold voltage of memory cell MC1. In this way, data is programmed into memory cell MC1.

When data is read out from memory cell MC1, voltage Vcc is supplied as voltage SW from power source switching circuit 102 to word line buffer 112. At this time, voltage Vcc is supplied from word line buffer 112 to the control gate of memory cell MC1. A voltage corresponding to data stored in memory cell MC1 to be supplied to sense amplifier 116 via column selection gate circuit 108. A reference voltage is also supplied from reference voltage generating circuit 122 to sense amplifier 116. Then, sense amplifier 116 compares the voltage supplied from memory cell MC1 with that supplied from reference cell DC and outputs the comparison result as readout data to the data line.

In the conventional EPROM, if power source voltage Vcc is varied by the influence of noise, the control gate voltage of the reference cell is also varied. However, since voltage SW is coupled with voltage Vcc via the transistor of voltage switching circuit 102, variation in the control gate voltage of the memory cell will become different from that in the control gate voltage of the reference cell. As a result, the characteristics of the memory cell and reference cell may become different from each other in the data readout operation, thereby causing the sense amplifier to erroneously operate.

Conventionally, in order to make the characteristics of the memory cell and reference cell equal to each other, the control gates of the memory cell and reference cell may be commonly connected to receive the same power source voltage SW. However, in this case, programming voltage Vpp is supplied to the control gate of the reference cell when data is programmed into the memory cell. In the ordinary operation, no electron is injected into the floating gate of the reference cell, but in this case, electrons may be injected into the floating gate by the high voltage stress due to application of voltage Vpp to the control gate thereof although it is small in amount. Accordingly, when the memory device is used over a long period of time, the operation characteristic of the reference cell may be changed. Further, with this method, each time a new one of the memory cells is selected, a corresponding one of the reference cells is selected, and therefore the reference potential may be changed depending on the selection of reference cell.

As described above, in the conventional semiconductor memory device, the gate of the reference cell is connected to directly receive the readout power source voltage and therefore there is a possibility that the sense amplifier may be erroneously operated by the influence of noise. Further, in the prior art, if the same voltage is supplied from the same power source to the control gates of the memory cell and reference cell in order to set the characteristics of the memory cell and reference cell equal to each other, the characteristic of the reference cell may be changed, or the reference potential may be changed when a new memory cell is selected, thus lowering the reliability thereof.

SUMMARY OF THE INVENTION

This invention has been made in view of the above fact, and an object of this invention is to provide a highly reliable semiconductor memory device in which the operation characteristics of memory cells and reference cells can be set equal to each other without applying an unwanted voltage stress to the reference cell.

In order to achieve the above object, a semiconductor memory device is characterized by comprising memory cells for storing data. The data being read out from the memory cell to generate a read voltage in a read mode and the data being written into the memory cell in a write mode; voltage switching circuit means for selectively generating one of first and second voltages according to a selected one of the read and write modes, the write modes being selectively set in response to a write-in control signal and the voltage switching circuit means generating the first voltage in the read mode and the second voltage in the write mode; a first driving circuit for driving the memory cell by a voltage output from the voltage switching circuit means according to a memory selection signal which is determined by an address; a sense amplifier for comparing a sense potential from the memory cell with a reference potential in the read mode to sense data stored in the memory cell; a reference cell for generating the reference potential in the read mode; and a second driving circuit for driving the reference cell by a voltage of the ground potential level in the write mode and by the first voltage in the read mode.

In order to achieve the above object, a method for protecting a reference cell from an unwanted voltage stress in the write-in operation of a semiconductor memory device is characterized by comprising the steps of:

applying a first voltage for data write-in to the gate of a memory cell in the write mode and applying a second voltage to the gate of the memory cell so as to generate a read voltage corresponding to the data in the read mode;

applying a ground potential to the gate of a reference cell in the write mode and applying the second voltage to the gate of the reference cell in the read mode so as to generate a reference potential; and comparing the read potential from the memory cell with the reference potential from the reference cell in the read mode to sense data stored in the memory cell.

As described above, according to this invention, a highly reliable semiconductor memory device in which the operation characteristics of the reference cell and memory cell can be made equal to each other without applying an unnecessary voltage stress to the reference cell can be obtained.

DETAILED DESCRIPTION OF THE PREFERRED EMBODIMENTS

There will now be described a semiconductor memory device according to one embodiment of this invention with reference to the accompanying drawings. Portions which are the same as those shown in FIG. 1 are denoted by the same reference numerals and the explanation therefor is omitted.

Figure 6:
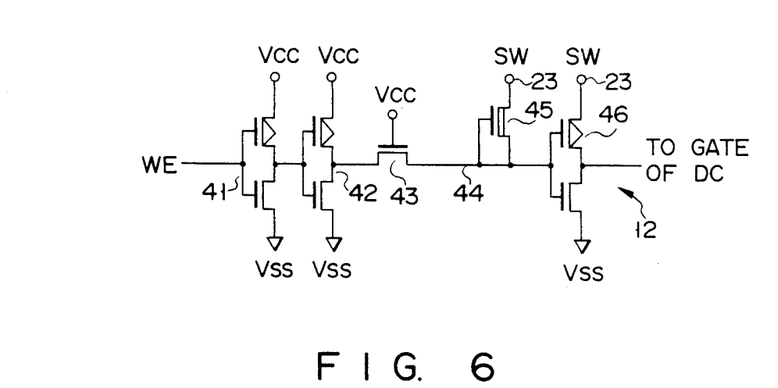
FIG. 6 is a circuit diagram showing the construction of a reference cell driving circuit shown in FIG. 3.

First, the construction of a semiconductor memory device according to the first embodiment of this invention is explained with reference to FIG. 3 by taking a nonvolatile semiconductor memory device (EPROM) as an example. In the EPROM provided as the semiconductor memory device according to this invention, an output of a word line buffer (first gate driving circuit) as shown in FIG. 1 is supplied to control gate 75 (FIG. 2) of memory cell MC1 and an output of reference cell driving circuit (second driving circuit) 12 specifically shown in FIG. 6 is supplied to the control gate of reference cell DC.

Figure 3:
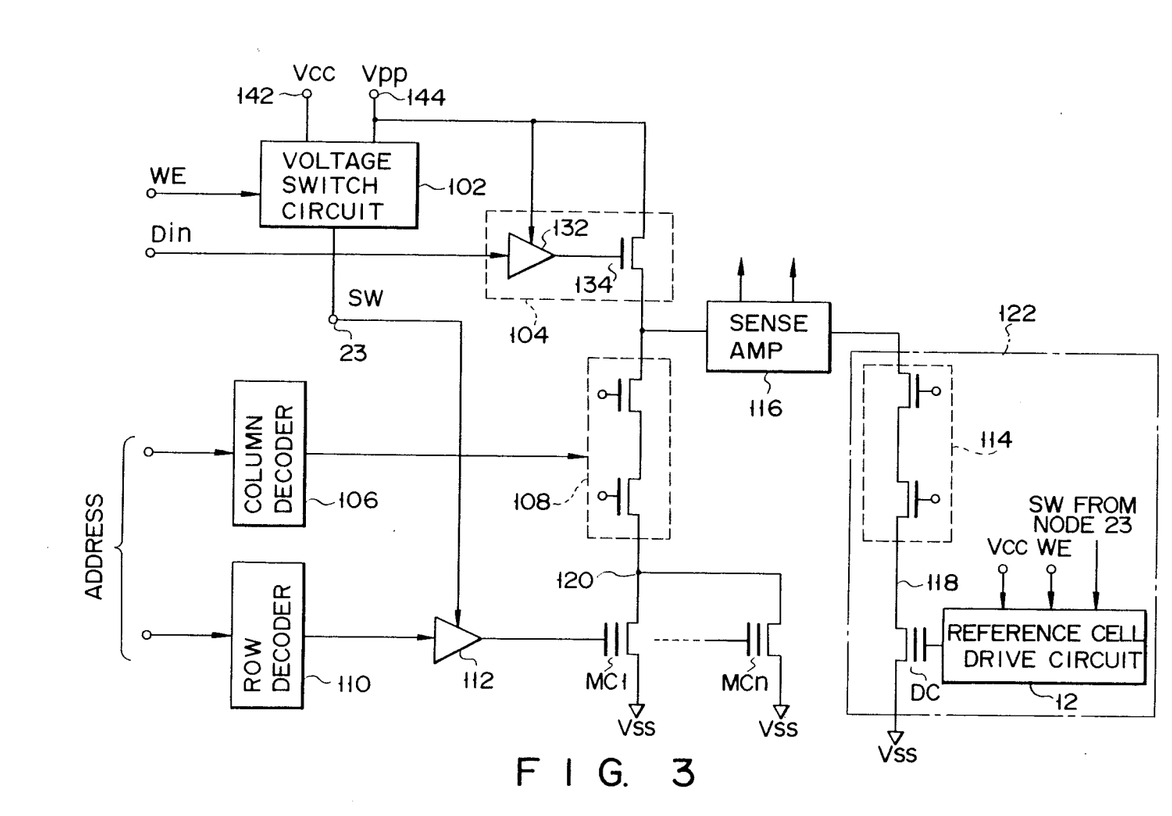
FIG. 3 is a block diagram showing the schematic construction of an EPROM to which this invention is applied.
Figure 4:
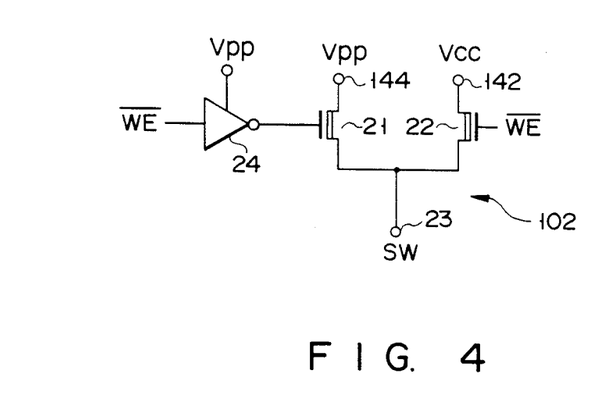
FIG. 4 is a block diagram showing the construction of a voltage switching circuit shown in FIG. 3.

FIG. 4 shows the specific construction of voltage switching circuit 102 shown in FIG. 3. As shown in FIG. 4, depletion type MOS transistor 21 whose gate is connected to receive inverted write control signal via voltage converter 24 WE is connected between terminal 144 to which programming voltage Vpp is supplied and output voltage node 23 and depletion type MOS transistor 22 whose gate is connected to receive inverted signal of write control signal WE is connected between terminal 142 to which voltage Vcc is supplied and output voltage node 23. In this case, transistors 21 and 22 are of N-channel type.

In circuit 102, write control signal WE is set to logic level "1" when data is programmed into memory cell MC1. As a result, transistor 21 is turned on to derive voltage Vpp as voltage SW at node 23. Further, in the data readout mode, the write control signal WE is set to logic level "0" to turn on transistor 22, and as a result, voltage Vcc is generated as voltage SW. Voltage SW is supplied to control gate 75 (FIG. 2) of memory cell MC1 via word line buffer 112.

Figure 5:
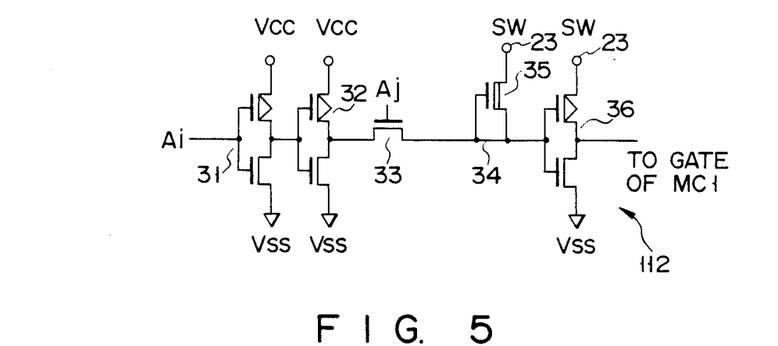
FIG. 5 is a circuit diagram showing the construction of a word line buffer shown in FIG. 3.

FIG. 5 shows the construction of word line buffer 112 to which voltage SW is supplied. CMOS inverter 31 is supplied with signal Ai which is obtained by decoding the row address by use of decoder 110. An output of inverter 31 is supplied to CMOS inverter 32. Further, an output of CMOS inverter 32 is supplied to node 34 via transistor 33 to which signal Aj obtained in the same manner as signal Ai is supplied. Depletion type transistor 35 having a gate connected to node 34 is connected between nodes 34 and 23. Further, a signal at node 34 is supplied to CMOS inverter 36 to which voltage SW is supplied.

In this way, voltage SW or Vss is supplied from word line buffer 112 to control gate 75 of memory cell MC1 via inverter 36 according to the input address.

FIG. 6 shows the detail circuit construction of reference cell driving circuit 12. Write control signal WE which is set to logic level "1" when data is programmed into memory cell MC1 and set to "0" at the other time is supplied to CMOS inverter 41. An output of inverter 41 is supplied to CMOS inverter 42 and an output of inverter 42 is supplied to node 44 via MOS transistor 43 whose gate is connected to receive power source voltage Vcc. Depletion type MOS transistor 45 is connected between nodes 44 and 23. Further, a signal at node 44 is supplied to CMOS inverter 46 to which voltage SW is supplied from node 23.

Now, the operation of the first embodiment of this invention is explained with reference to the timing chart shown in FIGS. 7A to 7D.

Figure 7:
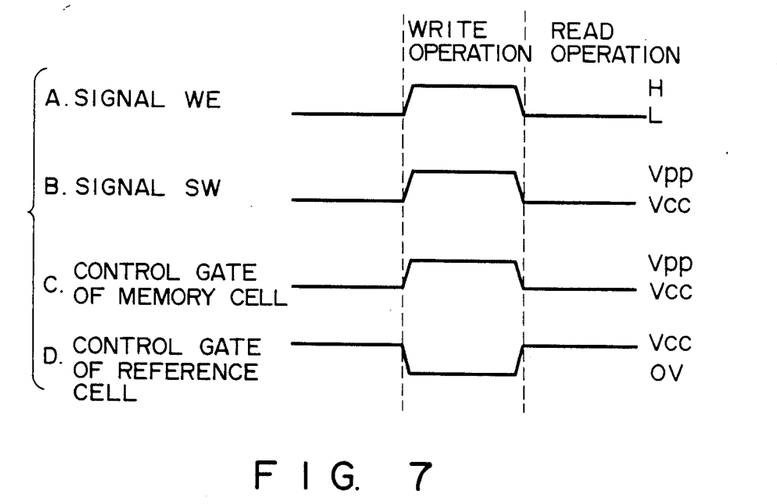
FIGS. 7A to 7D are timing charts for illustrating the operation of the semiconductor memory device of this invention.

In the EPROM of FIG. 3, signal WE is set at logic level "1" as shown in FIG. 7A when data is written into memory cell MC1. At this time, as shown in FIG. 7B, high voltage Vpp is output as voltage SW from voltage switching circuit 102 shown in FIG. 3. Further, in row decoder 112 of FIG. 5, signals Ai and Aj are produced based on the input address, and one of voltage SW and ground voltage Vss is selected according to signals Ai and Aj in word line buffer 112 shown in FIG. 5 and supplied to control gate 75 of memory cell MC1 as shown in FIG. 7C. That is, when signal Ai is at logic level "0", outputs of inverters 31 and 32 are respectively set to logic levels "1" and "0". At this time, if signal Aj is at logic level "1", transistor 33 is turned on to set the potential of node 34 to logic level "0", and as a result, voltage SW which is set at high voltage Vpp is supplied from inverter 36 to control gate 75 of memory cell MC1.

In this case, write control signal WE of logic level "1" is supplied to reference cell driving circuit 12 of FIG. 6 when data is programmed into memory cell MC1. Therefore, outputs of inverters 41 and 42 are respectively set to logic levels "0" and "1". As a result, voltage Vpp is supplied as voltage SW to node 44 via transistor 45, causing the N-channel MOS transistor of CMOS inverter 46 to be turned on and therefore voltage Vss of 0 V is applied to the control gate of reference cell DC as shown in FIG. 7D. Thus, high voltage Vpp is prevented from being applied to reference cell DC when data is written into memory cell MC1.

When data is read out from memory cell MC1, signal WE is set at logic level "1" as shown in FIG. 7A. At this time, voltage Vcc is output from voltage switching circuit 102 as voltage SW as shown in FIG. 7B. Further, one of voltage SW and ground voltage Vss is selected based on signals Ai and Aj in word line buffer 112 of FIG. 3 and supplied to control gate of memory cell MC1. In this case, since voltage SW is at Vcc, voltage Vcc is applied to control gate 75 of a selected one of memory cells MC1. When data is read out from memory cell MC1, write control signal WE of logic level "0" is supplied to reference cell driving circuit 12 of FIG. 6 and outputs of inverters 41 and 42 are respectively set to logic levels "1" and "0". Therefore, current is caused to flow from node 23 via transistors 45 and 43 and the N-channel MOS transistor of CMOS inverter 42, thereby setting node 44 to ground voltage Vss. As a result, the P-channel MOS transistor of CMOS inverter 46 is turned on, causing voltage Vcc to be supplied as voltage SW to the control gate of reference cell DC as shown in FIG. 7D. In response to voltage Vcc, reference voltage generation circuit 122 supplies a preset reference potential to sense amplifier 116, which compares the reference potential with an output voltage of memory cell MC1 and outputs the comparison result as readout data to the data line.

As described above, according to the construction of this invention, voltage Vcc is applied to the control gate of the reference cell to generate a reference potential used in the sense amplifier only in the data readout mode. On the other hand, in the data write mode, programming voltage Vpp is not applied to the control gate of the reference cell, causing no programming voltage stress and preventing electrons from being injected into the control gate. Further, since the reference cell driving circuit of FIG. 6 is controlled by write control signal WE, the reference potential is kept constant even if a different memory cell is selected. In the data readout mode, voltage Vcc applied to the control gate of the reference cell can be derived from an output voltage of voltage switching circuit 102 and is the same power source voltage as that for the memory cell. For this reason, even if voltage Vcc is varied by the influence of noise, voltages of the control gates of the reference cell and memory cell vary in the same manner. Therefore, the transistor characteristics of the reference cell and memory cell can be made equal to each other, preventing the sense amplifier from being erroneously operated by the influence of noise.

Figure 8:
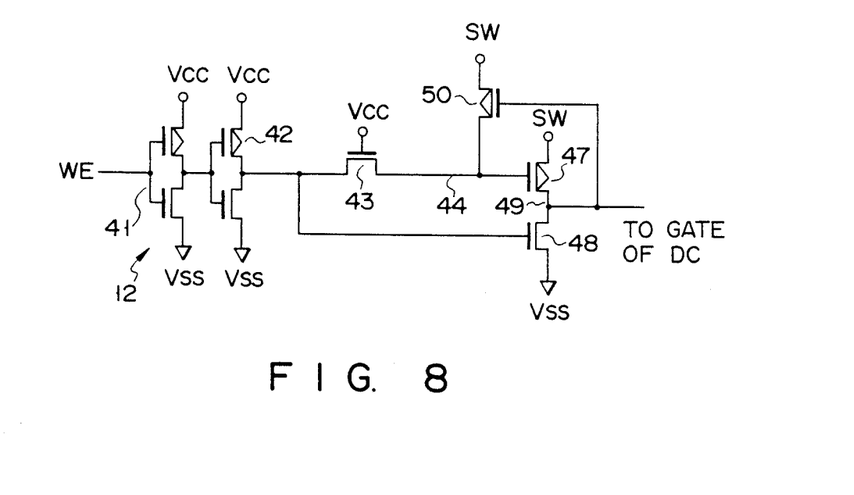
FIG. 8 is a circuit diagram showing another construction of the reference cell driving circuit.

FIG. 8 shows the construction of reference cell driving circuit 12 according to another embodiment of this invention. In the embodiment of FIG. 6, when write control signal WE is at logic level "0" and potential at node 44 is set at logic level "0", current constantly flows from node 23 to ground voltage terminal Vss via transistors 45 and 43 and inverter 42, increasing the power consumption.

In the embodiment of FIG. 8, CMOS gate circuit 49 constituted by P-channel MOS transistor 47 and N-channel MOS transistor 48 is used instead of CMOS inverter 46 of FIG. 6. The gate of transistor 47 is connected to node 44 and the gate of transistor 48 is connected to the output node of inverter 42. Further, enhancement type P-channel MOS transistor 50 is connected between nodes 44 and 23 instead of depletion type MOS transistor 45. The gate of MOS transistor 50 is connected to the output node of gate circuit 49.

With reference cell driving circuit 12 of the above construction, P-channel MOS transistor 47 of gate circuit 49 is turned on and gate circuit 49 generates voltage SW when write-in control signal WE is at logic level "0" and the output of inverter 42 is set at logic level "0". As a result, P-channel transistor 50 is turned off, preventing current from flowing in a path from voltage terminal SW to ground voltage terminal Vss. On the other hand, when write control signal WE is at logic level "1", the output of inverter 42 is set to logic level "1" and N-channel transistor 48 of gate circuit 49 is turned on, permitting gate circuit 49 to supply ground voltage Vss to the control gate of the reference cell.

What is claimed is:

1. A semiconductor memory device comprising:
    a memory cell connected to a ground potential, for storing data, the data being read out from said memory cell in a read mode and the data being written into said memory cell in a write mode;
    potential switching means for selectively generating one of first and second potentials in accordance with a mode set as one of the read and write modes, the write mode being set in response to a write control signal and said potential switching means generating the first potential in the read mode and the second potential in the write mode;
    first driving means for driving said memory cell in accordance with one of the first and second potentials from said potential switching means in accordance with a memory cell selection signal which is determined by an input address;
    sense amplifier means or comparing a sense potential corresponding to the data from said memory cell with a reference potential input thereto in the read mode to sense the data stored in said memory cell;
    a reference cell connected to the ground potential, for generating and outputting the reference potential to said sense amplifier means in the read mode; and
    second driving means connected to the ground potential, for driving said reference cell in accordance with the reference potential in the write mode and the output of said potential switching means in the read mode as a drive potential.

2. A device according to claim 1, wherein said second driving means comprises:
    a first transistor connected to a first node, for setting said first node to the ground potential in the read mode;
    a second transistor connected between said first node and said potential switching means , for setting said first node to a potential determined in accordance with the second potential from said potential switching means in the write mode; and
    a CMOS gate circuit for receiving one of the first and second potentials from said potential switching means, for driving said reference cell in accordance with the potential of said first node.

3. A device according to claim 2, wherein said first transistor is an N-channel transistor having a source connected to receive the write control signal, a gate supplied with the first potential and a drain connected to said first node, and said second transistor is a depletion type N-channel MOS transistor having a drain connected to said potential switching means and a gate and a source connected to said first node.

4. A device according to claim 1, wherein said second driving means comprises:
    a first transistor connected between first and second nodes, for setting said first node to the ground potential in the read mode, the potential of said second node being set to the ground potential in the read mode and to the first potential in the write mode;
    a second transistor connected between said first node and said potential switching means, for setting said first node to a potential determined in accordance with the second potential from said potential switching means in the write mode;
    a P-channel MOS transistor supplied with one of the first and second potentials from said potential switching means, for driving said reference cell in accordance with the potential of said first node, and
    an N-channel MOS transistor connected to said P-channel MOS transistor, for driving said reference cell in accordance with the potential of said second node.

5. A device according to claim 4, wherein said first transistor is an N-channel transistor having a source connected to said second node, a gate supplied with the first potential and a drain connected to said first node; and said second transistor is a P-channel MOS transistor having a source connected to said voltage switching means, a drain connected to said first node and a gate connected to a connection node between said P-channel and N-channel MOS transistors.

6. A device according to claim 1, wherein said second driving means comprises:
    a first transistor for potential separation connected between a terminal to which the write control signal is supplied and a first node;
    a second transistor connected between said first node and said potential switching means for charging said first node; and
    a CMOS gate circuit supplied with one of the first and second potentials from said potential switching means for operating in accordance with a potential of said first node.

7. A device according to claim 1, wherein said second driving means comprises:
    a first transistor for potential separation connected between a terminal to which the write control signal is supplied and a first node;

a CMOS gate circuit supplied with one of the first and second potentials from said potentials switching means and connected to receive the write control signal and a signal of said first node; and a second transistor for charging connected between said first node and said potential switching means and having a gate connected to an output of said CMOS gate circuit.

8. A method for protecting a reference cell from an undesired potential stress in the write-in operation of a semiconductor memory device comprising the steps of:

applying a first potential to the gate of a memory cell in a read mode to generate a sense potential corresponding to data and applying a second potential for data write to the gate of said memory cell in the read mode;

applying a ground potential to a gate of a reference cell in the write mode and applying the first potential to the gate of said reference cell in the read mode to generate a reference sense potential; and comparing the sense potential from said memory cell with the reference potential from said reference cell in the read mode to sense the data stored in said memory cell.

9. A method according to claim 8, wherein the step of applying one of the ground and first potential to the gate of said reference cell comprises the steps of:

setting a first node to the ground potential in the read mode;

setting said first node to the second potential in the write mode; and applying the ground potential to the gate of said reference cell in the write mode or applying the first potential to the gate of said reference cell in the read mode in accordance with a potential of said first node.

10. A method according to claim 8, wherein the step of applying the potential to the gate of said reference cell comprises the steps of:

setting a first node to the ground potential in the read mode;

setting a potential of a second node to the ground potential in the read mode and to the first potential in the write mode;

setting a potential of said first node to the second potential in the write mode;

applying the first potential to the gate of said reference cell in accordance with the potential of said first node in the read mode; and applying the ground potential to the gate of said reference cell according to the potential of said second node.

* * * * *

UNITED STATES PATENT AND TRADEMARK OFFICE
CERTIFICATE OF CORRECTION

PATENT NO.  : 4,974,206
DATED       : November 27, 1990
INVENTOR(S) : Iyama et al.

It is certified that error appears in the above-identified patent and that said Letters Patent is hereby corrected as shown below:

Claim 1, column 7, line 54, change "or" to --for--.

Signed and Sealed this

Seventh Day of December, 1993

Attest:

BRUCE LEHMAN

*Attesting Officer*     *Commissioner of Patents and Trademarks*